US010682674B2

(12) United States Patent
Jung et al.

(10) Patent No.: US 10,682,674 B2
(45) Date of Patent: Jun. 16, 2020

(54) APPARATUS AND METHOD FOR TREATING SUBSTRATE

(71) Applicant: SEMES CO., LTD., Cheonan-si, Chungcheongnam-do (KR)

(72) Inventors: Younghun Jung, Asan-si (KR); Chang Uk Park, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 15/796,415

(22) Filed: Oct. 27, 2017

(65) Prior Publication Data

US 2018/0117641 A1  May 3, 2018

(30) Foreign Application Priority Data

Oct. 31, 2016  (KR) .................. 10-2016-0143129

(51) Int. Cl.
*B08B 3/10* (2006.01)
*B08B 11/02* (2006.01)
(Continued)

(52) U.S. Cl.
CPC ............... *B08B 3/10* (2013.01); *B05B 9/002* (2013.01); *B05C 11/1042* (2013.01); *B08B 3/08* (2013.01);
(Continued)

(58) Field of Classification Search
None
See application file for complete search history.

(56) References Cited

U.S. PATENT DOCUMENTS

| 9,214,367 B2* | 12/2015 | Pursche | H01L 21/67109 |
| 2002/0066725 A1* | 6/2002 | Lee | H01L 21/67103 219/444.1 |
| 2003/0201184 A1* | 10/2003 | Dordi | C25D 21/00 205/80 |

FOREIGN PATENT DOCUMENTS

| JP | H05029206 A | 2/1993 |
| JP | H05-326483 A | 12/1993 |

(Continued)

OTHER PUBLICATIONS

Office Action for related Korean Patent Application No. 1020160143129, dated Feb. 13, 2018; 14 pages, Not in English. Considered to the extent it was understood.

*Primary Examiner* — Eric W Golightly
(74) *Attorney, Agent, or Firm* — Procopio, Cory, Hargreaves & Savitch LLP

(57) ABSTRACT

Embodiments of the inventive concept relate to an apparatus and a method for removing a liquid residing on a substrate. The substrate treating apparatus includes a substrate support unit configured to support the substrate, a liquid supply unit configured to supply a liquid onto the substrate supported by the substrate support unit, and a heating unit configured to heat the substrate supported by the substrate support unit, wherein the substrate support unit includes a support plate having a seating surface, on which the substrate is seated, and having a suction hole on the seating surface, a rotary shaft configured to rotate the support plate, and a vacuum member configured to reduce a pressure of the suction hole such that the substrate seated on the seating surface is vacuum-suctioned on the support plate. Accordingly, the drying efficiency of the substrate may be increased.

10 Claims, 12 Drawing Sheets

(51) Int. Cl.
    *H01L 21/67*     (2006.01)
    *H01L 21/683*     (2006.01)
    *H01L 21/687*     (2006.01)
    *B05B 9/00*     (2006.01)
    *B05C 11/10*     (2006.01)
    *B08B 3/08*     (2006.01)
    *C11D 11/00*     (2006.01)
    *H01L 21/02*     (2006.01)
    *B08B 3/02*     (2006.01)

(52) U.S. Cl.
    CPC .......... *B08B 11/02* (2013.01); *C11D 11/0047* (2013.01); *H01L 21/02052* (2013.01); *H01L 21/6715* (2013.01); *H01L 21/6719* (2013.01); *H01L 21/67028* (2013.01); *H01L 21/67051* (2013.01); *H01L 21/67103* (2013.01); *H01L 21/67178* (2013.01); *H01L 21/6838* (2013.01); *H01L 21/6875* (2013.01); *H01L 21/68764* (2013.01); *H01L 21/68785* (2013.01); *B08B 3/024* (2013.01); *B08B 2203/0229* (2013.01)

(56) References Cited

FOREIGN PATENT DOCUMENTS

| | | |
|---|---|---|
| JP | H11008227 A | 1/1999 |
| JP | 2002-361167 A | 12/2002 |
| KR | 1020040082101 A | 9/2004 |
| KR | 1020140138744 A | 12/2014 |
| KR | 10-2015-0001739 A | 1/2015 |
| KR | 10-2015-0126281 A | 11/2015 |

\* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2016-0143129 filed on Oct. 31, 2016, in the Korean Intellectual Property Office, the entire contents of which are hereby incorporated by reference.

BACKGROUND

Embodiments of the inventive concept relate to an apparatus and a method for liquid-treating a substrate, and more particularly, to an apparatus and a method for removing a liquid residing on a substrate.

A process of manufacturing a semiconductor device and a flat panel display panel includes various processes including a photographing process, an etching process, an ashing process, a thin film deposition process, and a cleaning process. Among the processes, in the photographing process, application, exposure, and development steps are sequentially performed. The application process is a process of applying a photosensitive liquid such as a resist onto a surface of a substrate. The exposure process is a process of exposing a circuit pattern on a substrate in which a photosensitive film is formed. The development process is a process of selectively developing an exposed area of a substrate.

In general, a development process includes a development liquid supplying operation, a rinsing liquid supplying operation, and a drying operation. The development liquid supplying operation, the rinsing liquid supplying operation, and the drying operation are sequentially performed. The development liquid supplying operation is an operation of developing an exposed area by supplying a development liquid onto a substrate, and the rinsing liquid supplying operation is an operation of rinsing process side-products and residual development liquids generated by the development liquid. The drying operation is an operation of drying the rinsing liquid residing on the substrate.

The substrate is rotated at different speeds in the operations, and the substrate is rotated at a higher speed in the driving operation than in the development liquid supplying operation and the rinsing liquid supplying operation, in order to dry the liquid.

However, as the line width of the pattern becomes finer to 30 nm or less, a pattern collapse a phenomenon, in which patterns are collapsed, frequently occurs in the process of drying the rinsing liquid, as illustrated in FIG. 1. In addition, rotational speeds of the substrate are different for areas, and thus the areas of the substrate cannot be uniformly dried.

SUMMARY

Embodiments of the inventive concept provide an apparatus and a method for stably drying a substrate.

Embodiments of the inventive concept also provide an apparatus and a method for uniformly drying areas of a substrate.

Embodiments of the inventive concept provide an apparatus and a method for removing a liquid residing on a substrate.

In accordance with an aspect of the inventive concept, there is provided a substrate treating apparatus including a substrate support unit configured to support the substrate, a liquid supply unit configured to supply a liquid onto the substrate supported by the substrate support unit, and a heating unit configured to heat the substrate supported by the substrate support unit, wherein the substrate support unit includes a support plate having a seating surface, on which the substrate is seated, and having a suction hole on the seating surface, a rotary shaft configured to rotate the support plate, and a vacuum member configured to reduce a pressure of the suction hole such that the substrate seated on the seating surface is vacuum-suctioned on the support plate.

The seating surface may have an area that is smaller than the substrate, the heating unit may include a first heating member located below the substrate supported by the substrate support unit, and the first heating member may include a heating plate having a shape surrounding a circumference of the support plate, and a first heater provided in the heating plate. The heating unit may further include a second heating member located above the substrate supported by the substrate support unit, the first heating member may heat a peripheral area of the substrate, and the second heating member may heat a central area of the substrate. The liquid supply unit may include a treatment nozzle configured to supply a treatment liquid onto the substrate seated on the support plate above the support plate, and a cleaning nozzle installed in the heating plate and configured to supply a cleaning liquid to a bottom surface of the substrate seated on the support plate. The treatment liquid may include a development liquid.

The liquid supply unit further may include a rinsing nozzle configured to supply a rinsing liquid onto the substrate seated on the support plate above the support plate, the substrate treating apparatus may further include a controller configured to control the liquid supply unit and the heating unit, the controller may control the liquid supply unit and the heating unit to sequentially perform a treatment liquid supplying operation of supplying the treatment liquid onto the substrate, a rinsing liquid supplying operation of supplying the rinsing liquid onto the substrate, and a drying operation of removing the rinsing liquid residing on the substrate, and the controller may control the substrate support unit to rotate the substrate at a treatment speed in the treatment liquid supplying operation, to rotate the substrate at a rinsing speed in the rinsing liquid supplying operation, and to rotate the substrate at a drying speed that is lower than the treatment speed and the rinsing speed in the drying operation. The first heating member may further include an elevation member configured to elevate one of the heating plate and the support plate to adjust a relative height between the heating plate and the support plate, the elevation member may move the heating plate and the support plate by a first interval or a second interval that is smaller than the first interval, and the controller may move the heating plate and the support plate by the first interval in the rinsing liquid supplying operation, and moves the heating plate and the support plate by the first interval in the drying operation.

In accordance with another aspect of the inventive concept, there is provided a method for treating a substrate, the method including a liquid supplying operation of supplying a liquid onto a rotated substrate, and a drying operation of, after the liquid supplying operation, heating the rotated substrate.

The substrate may be rotated while the substrate is vacuum-suctioned on the support plate. A seating surface of the support plate, on which the substrate is seated, may have an area that is smaller than the substrate, and the substrate may be heated by heating a peripheral area of the substrate, by a first heater located below the substrate. An interval between the support plate and the first heater may be adjusted to a first interval in the liquid supplying operation, the interval between the support plate and the first heater may be adjusted to a second interval in the drying operation, and the second interval may be smaller than the first interval. A second heater located above the substrate may heat a central area of the substrate in the drying operation. The liquid supplying operation may include a treatment liquid supplying operation of supplying the treatment liquid onto the substrate, by a treatment nozzle located above the substrate, and a rinsing liquid supplying operation of supplying a rinsing liquid onto the substrate, by a rinsing nozzle located above the substrate, and a cleaning nozzle located below the substrate may supply a cleaning liquid to a peripheral area of the substrate in the rinsing liquid supplying operation. The treatment liquid may include a development liquid.

The substrate support unit may be controlled such that the substrate is rotated at a treatment speed in the treatment liquid supplying operation, the substrate is rotated at a rinsing speed in the rinsing liquid supplying operation, and the substrate is rotated at a drying speed that is lower than the treatment speed and the rinsing speed in the drying operation.

In accordance with another aspect of the inventive concept, there is provided a substrate treating apparatus including a substrate support unit configured to support the substrate, a liquid supply unit having a treatment nozzle configured to supply a treatment liquid onto the substrate supported on the substrate support unit and a rinsing nozzle configured to supply a rinsing liquid onto the substrate, a heating unit configured to heat the substrate supported by the substrate support unit, and a controller configured to control the substrate support unit and the liquid supply unit, wherein the substrate support unit includes a support plate having a seating surface, on which the substrate is seated, and a rotary shaft configured to rotate the support plate, wherein the controller controls the liquid supply unit and the heating unit to sequentially perform a treatment liquid supplying operation of supplying the treatment liquid onto the substrate, a rinsing liquid supplying operation of supplying the rinsing liquid onto the substrate, and a drying operation of removing the rinsing liquid residing on the substrate, and wherein the controller controls the substrate support unit to rotate the substrate at a treatment speed in the treatment liquid supplying operation, to rotate the substrate at a rinsing speed in the rinsing liquid supplying operation, and to rotate the substrate at a drying speed that is lower than the rinsing speed in the drying operation.

A suction hole may be formed on the seating surface, and the substrate support unit may further include a vacuum member configured to reduce a pressure of the suction hole such that the substrate seated on the seating surface is vacuum-suctioned on the support plate. The seating surface may have an area that is smaller than the substrate, the heating unit may include a first heating member located below the substrate supported by the substrate support unit, and the first heating member may include a heating plate having a shape surrounding a circumference of the support plate, and a first heater provided in the heating plate. The first heating member may further include an elevation member configured to elevate one of the heating plate and the support plate to adjust a relative height between the heating plate and the support plate, the elevation member may move the heating plate and the support plate by a first interval in the rinsing liquid supplying operation, and may move the heating plate and the support plate by a second interval in the drying operation, and the second interval may be smaller than the first interval.

The heating unit may further include a second heating member located above the substrate supported by the substrate support unit, the first heating member may heat a peripheral area of the substrate, and the second heating member may heat a central area of the substrate. The treatment liquid may include a development liquid.

In accordance with another aspect of the inventive concept, there is provided a method for liquid-treating a substrate, including a treatment liquid supplying operation of supplying a treatment liquid onto the substrate rotated, a rinsing liquid supplying operation of supplying a rinsing liquid onto the substrate rotated, and a drying operation of removing the rinsing liquid residing on the substrate rotated, wherein the substrate is rotated at a treatment speed in the treatment liquid supplying operation, wherein the substrate is rotated at a rinsing speed in the rinsing liquid supplying operation, and wherein the substrate is rotated at a drying speed that is lower than the rinsing speed in the drying operation.

The treatment liquid may include a development liquid. A first heater located below the substrate may heat a peripheral area of the substrate in the drying operation. The substrate or the first heater may be moved such that an interval between the substrate and the first heater becomes a first interval in the rinsing liquid supplying operation, the substrate or the first heater may be moved such that an interval between the substrate and the first heater becomes a second interval in the drying operation, and the second interval may be smaller than the first interval. A second heater located above the substrate may heat a central area of the substrate in the drying operation.

In accordance with another aspect of the inventive concept, there is provided a substrate treating apparatus including a support plate having a seating surface, on which the substrate is seated, and having a suction hole on the seating surface, a vacuum member configured to reduce a pressure of the suction hole, and a first heating member configured to heat a peripheral area of the substrate supported on the support plate, wherein the first heating member includes a heating plate surrounding a circumference of the support plate below the substrate supported on the support plate, and a first heater provided in the heating plate.

The seating surface may have an area that is smaller than the substrate, and the heating plate may have an inner diameter corresponding to an outer diameter of the support plate and having an annular ring shape having an outer diameter corresponding to the substrate. The first heating member may further include an elevation member configured to elevate one of the heating plate and the support plate to adjust a relative height between the heating plate and the support plate, and the elevation member may move the heating plate and the support plate at a first interval or a second interval that is smaller than the first interval.

The substrate treating system may further include a second heating member configured to heat a central area of the substrate supported on the support plate, and the second heating member may include a second heater located above the substrate supported on the support plate. The second heater may have a circular plate shape having a diameter corresponding to the seating surface.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

The system of the present embodiment of the inventive concept may be used to perform a photography process on a substrate such as a semiconductor wafer or a flat display panel. In particular, the system of the present embodiment may be connected to an exposure apparatus to perform a development process on a substrate. However, the present embodiment is not limited thereto, but any process of liquid-treating a substrate may be variously applied. Hereinafter, it will be exemplified in the embodiment that a wafer is used as a substrate.

Hereinafter, a substrate treating system according to the inventive concept will be described with reference to FIGS. 2 to 14.

Figure 1:
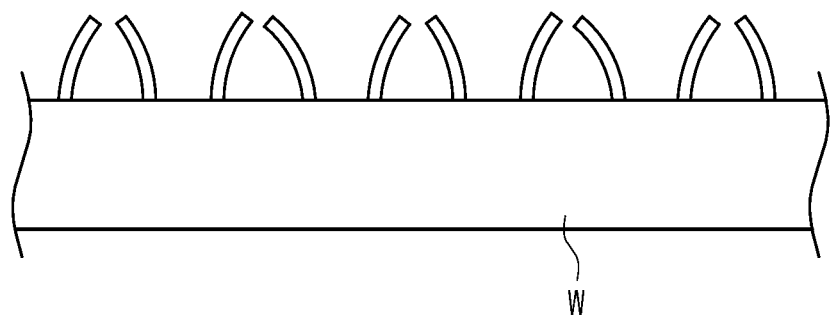
FIG. 1 is a sectional view illustrating a general process of drying a substrate.
Figure 2:
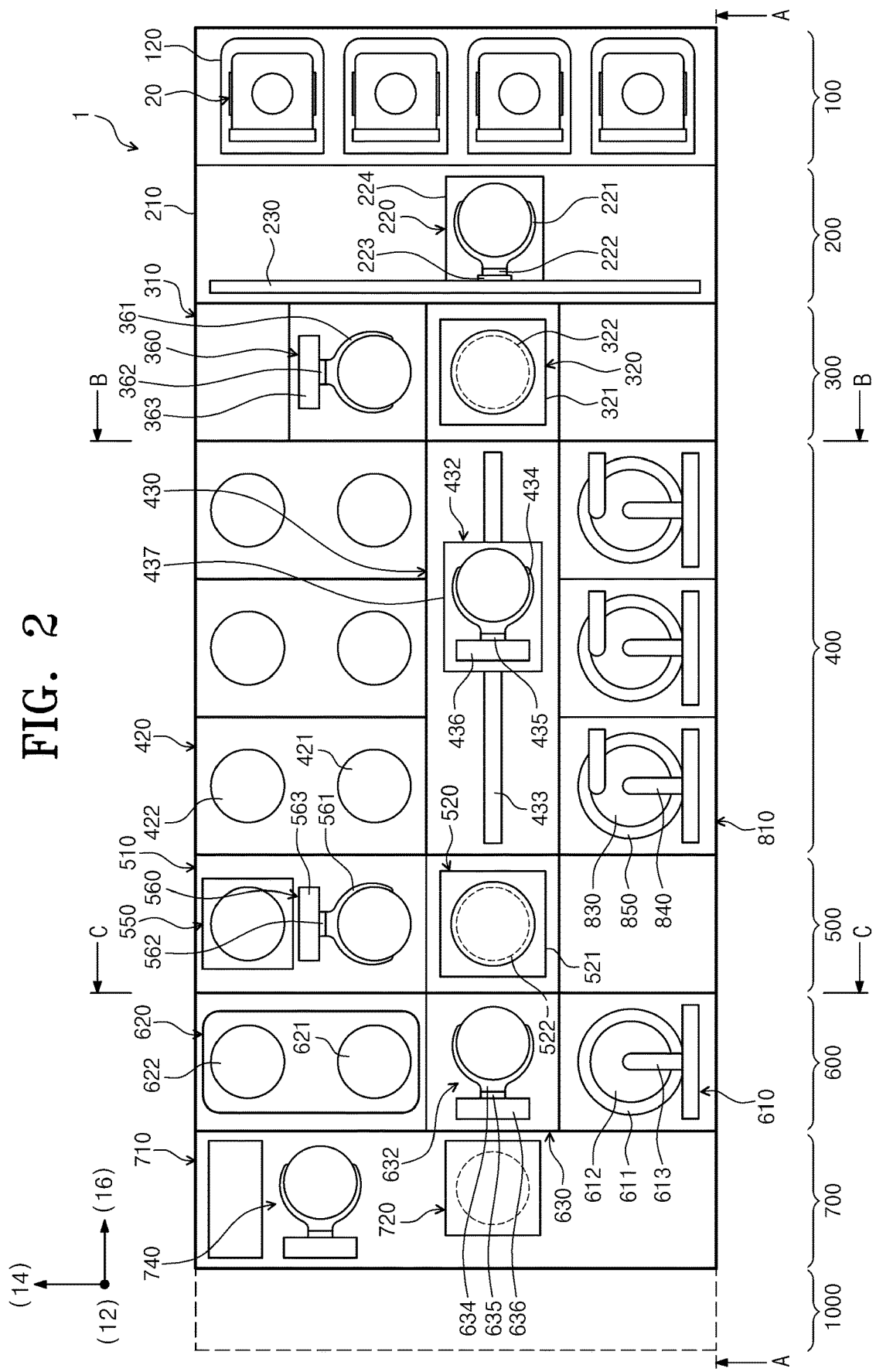
FIG. 2 is a plan view illustrating a substrate treating system according to an embodiment of the inventive concept.
Figure 3:
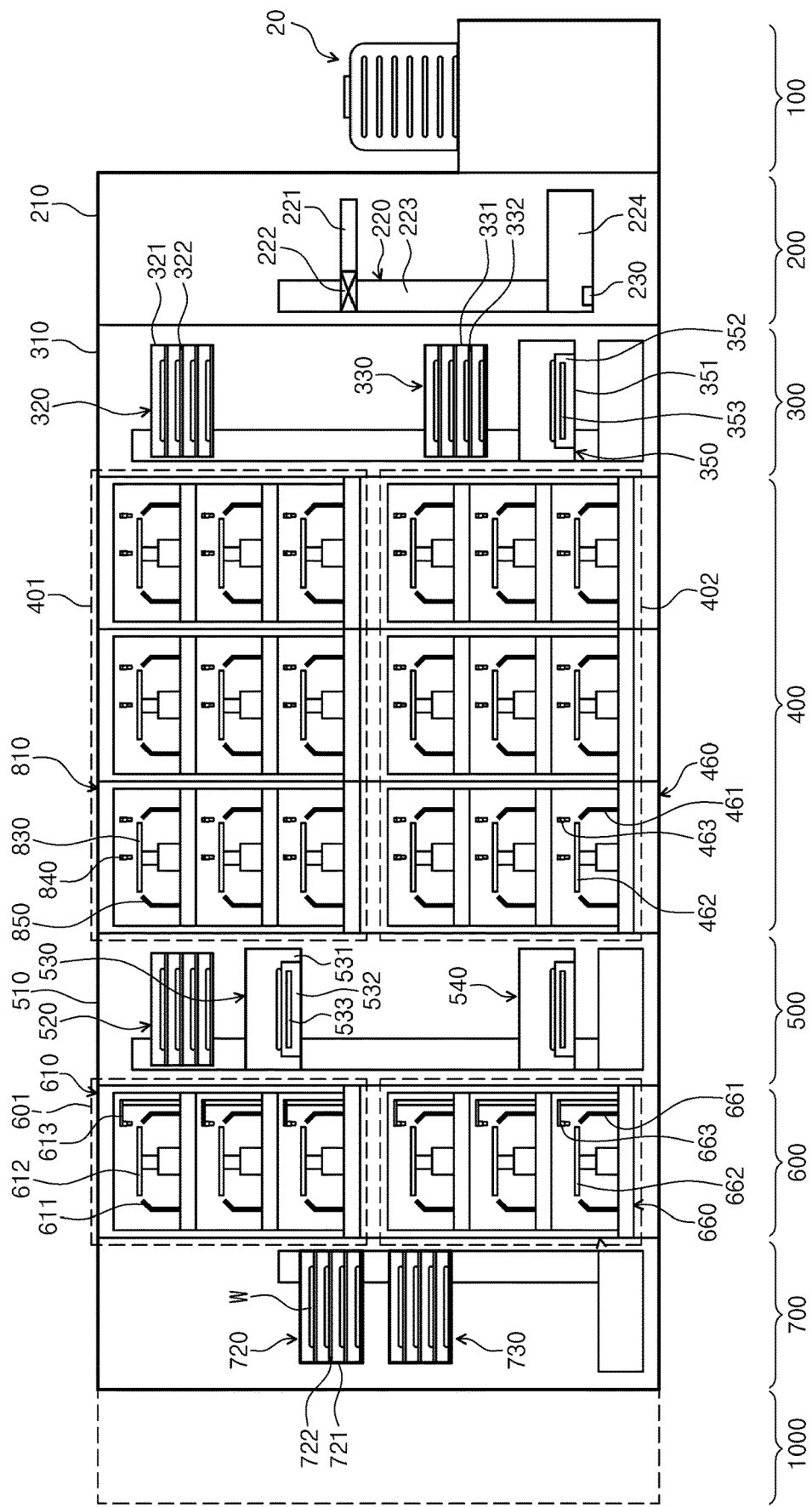
FIG. 3 is a sectional view of the system of FIG. 2, taken along a line A-A of FIG. 2.
Figure 4:
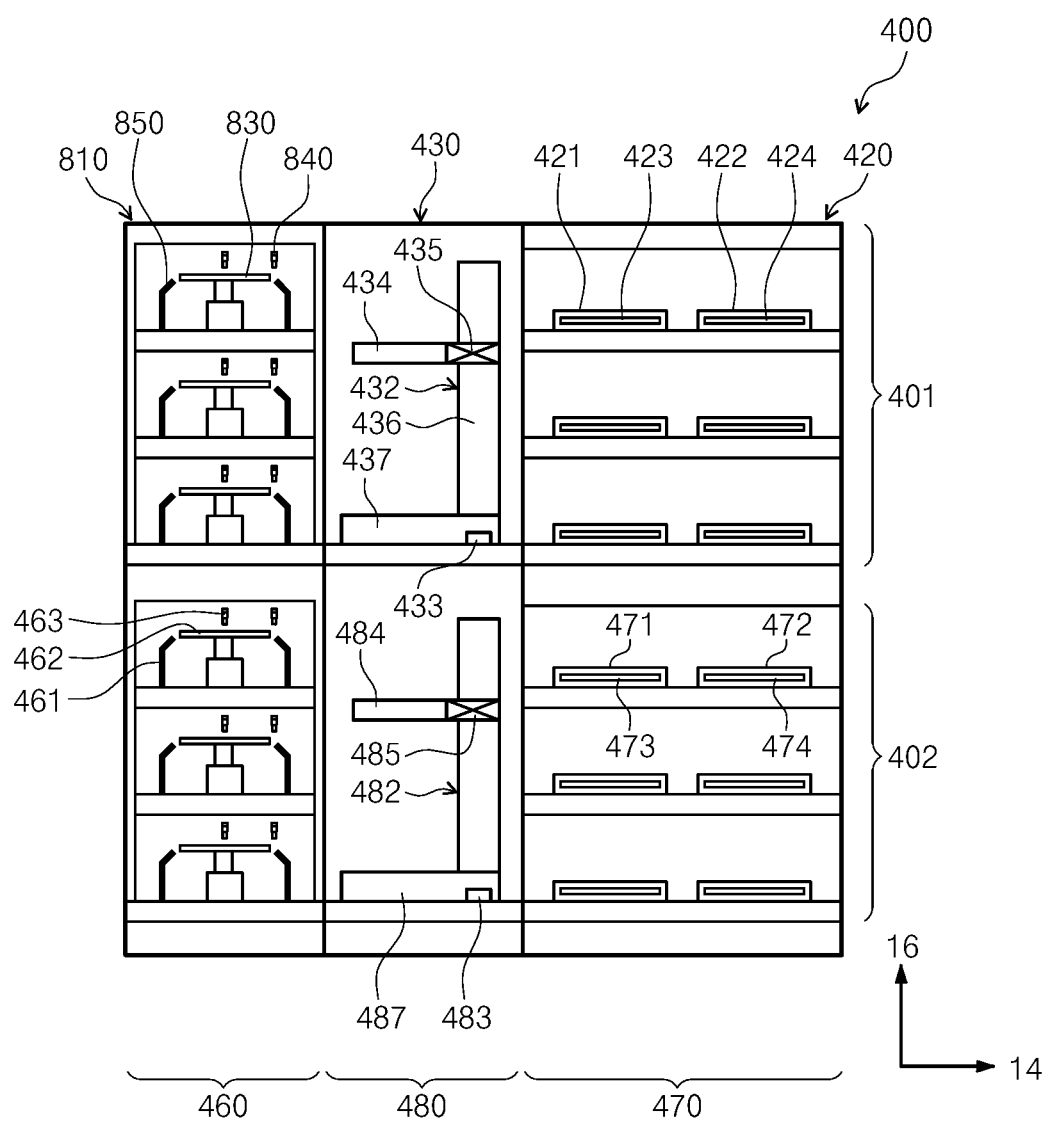
FIG. 4 is a sectional view of the system of FIG. 2, taken along line B-B of FIG. 2.
Figure 5:
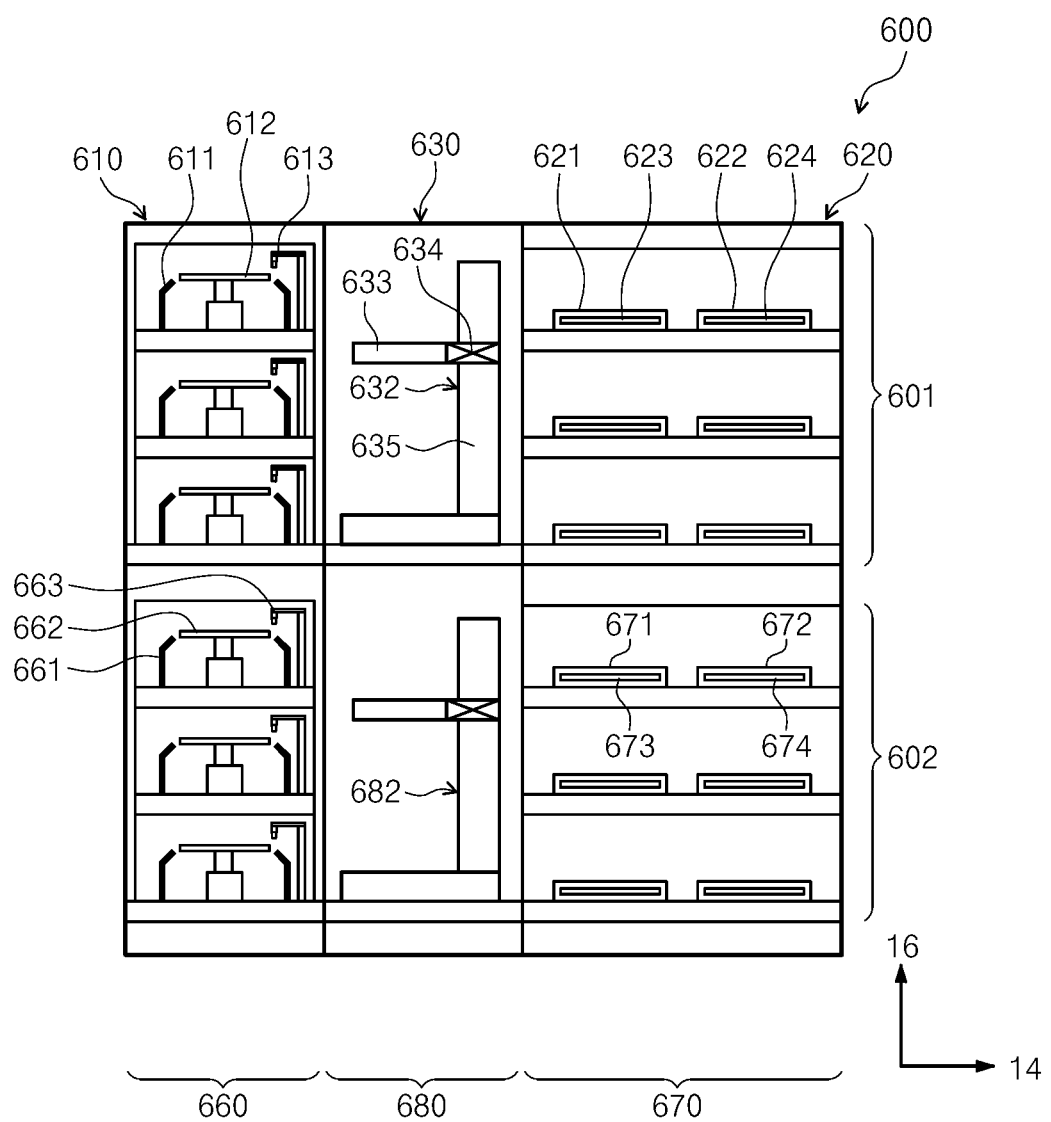
FIG. 5 is a sectional view of the system of FIG. 2, taken along a line C-C of FIG. 2.

FIG. 2 is a plan view illustrating a substrate treating system according to an embodiment of the inventive concept. FIG. 3 is a sectional view of the system of FIG. 2, taken along a line A-A of FIG. 2. FIG. 4 is a sectional view of the system of FIG. 2, taken along line B-B of FIG. 2. FIG. 5 is a sectional view of the system of FIG. 2, taken along a line C-C of FIG. 2.

Referring to FIGS. 2 to 5, the substrate treating system 1 includes a load port 100, an index module 200, a first buffer module 300, an application/development module 400, a second buffer module 500, a pre/post-exposure treating module 600, and an interface module 700. The load port 100, the index module 200, the first buffer module 300, the application/development module 400, the second buffer module 500, the pre/post-exposure treating module 600, and the interface module 700 are sequentially disposed in a row in one direction.

Hereinafter, a direction in which the load port 100, the index module 200, the first buffer module 300, the application/development module 400, the second buffer module 500, the pre/post-exposure treating module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate W is moved while being received in a cassette 20. Then, the cassette 20 has a structure that is sealed from the outside. For example, a front open unified pod (FOUP) that has a door on the front side may be used as the cassette 20.

Hereinafter, the load port 100, the index module 200, the first buffer module 300, the application/development module 400, the second buffer module 500, the pre/post-exposure treating module 600, and the interface module 700 will be described in detail.

The load port 100 has a carrier 120 on which the cassette 20, in which the substrates W are received, is positioned. A plurality of carriers 120 are provided, and are disposed along the second direction 14 in a row. In FIG. 2, four carriers 120 are provided.

The index module 200 feeds a substrate W between the cassette 20 positioned on the carrier 120 of the load port 100 and the first buffer module 300. The index module 200 has a frame 210, an index robot 220, and a guide rail 230. The frame 210 has a substantially rectangular parallelepiped shape having an empty interior, and is disposed between the load part 100 and the first buffer module 300. The frame 210 of the index module 200 may have a height smaller than that of a frame 310 of the first buffer module 300, which will be described below. The index robot 220 and the guide rail 230 are disposed in the frame 210. The index robot 220 has a four-axis driven structure such that a hand 221 that directly handles a substrate W is movable and rotatable in the first direction 12, the second direction 14, and the third direction 16. The index robot 220 has a hand 221, an arm 222, a support 223, and a prop 224. The hand 221 is fixedly installed in the arm 222. The arm 222 has a flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having an empty interior, and is disposed between the index module 200 and the application/development module 400. The first buffer 320, the second buffer 330, the cooling chamber 350, and the first buffer robot 360 are situated within the frame 310. The cooling chamber 350, the second buffer 330, and the first buffer 320 are disposed along the third direction 16 sequentially from the bottom.

The first buffer 320 is situated at a height corresponding to an application module 401 of the application/development module 400, which will be described below, and the second buffer 330 and the cooling chamber 350 are situated at a height corresponding to a development module 402 of the application/development module 400, which will be described below. The first buffer robot 360 is spaced apart by a predetermined distance in the second direction 14 from the second buffer 330, the cooling chamber 350, and the first buffer 320.

The first buffer 320 and the second buffer 330 temporarily preserve a plurality of substrates W. The second buffer 330 has a housing 331 and a plurality of supports 332. The supports 332 are disposed within the housing 331, and are spaced apart from one another along the third direction 16. One substrate W is positioned on each of the supports 332. The housing 331 has openings (not illustrated) on a side on which the index robot 220 is provided, on a side on which the first buffer robot 360 is provided, and on a side on which a development robot 482 is provided so that the index robot 220, the first buffer robot 360, and a development robot 482 of the development module 402, which will be described below, carries a substrate W into or out of the support 332 in the housing 331. The first buffer 320 has a structure that is substantially similar to that of the second buffer 330. Meanwhile, the housing 321 of the first buffer 320 has an opening on a side on which the first buffer robot 360 is provided and on a side on which an application robot 432 situated in the application module 401, which will be described below, is provided. The number of supports 322 provided for the first buffer 320 and the number of supports 332 provided for the second buffer 330 may be the same or different. According to an embodiment, the number of the supports 332 provided for the second buffer 330 may be larger than the number of the supports 332 provided for the first buffer 320.

The first buffer robot 360 feeds a substrate W between the first buffer 320 and the second buffer 330. The first buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The first buffer robot 360 may be provided such that the hand 361 is simply two-axis driven along the second direction 14 and the third direction 16.

The cooling chamber 350 cools a substrate W. The cooling chamber 350 has a housing 351 and a cooling plate 352. The cooling plate 352 has a cooling unit 353 that cools an upper surface thereof on which a substrate W is positioned and the substrate W. Various types such as a cooling type using cooling water and a cooling type using a thermoelectric element may be used as the cooling unit 353. A lift pin assembly (not illustrated) that locates a substrate W on the cooling plate 352 may be provided in the cooling chamber 350. The housing 351 has openings (not illustrated) on a side on which the index robot 220 is provided and on a side on which the development robot 482 is provided so that the index robot 220 and the development robot 482 provided for the development module 402, which will be described below, carry a substrate W into or out of the cooling plate 352. Doors (not illustrated) that open and close the aforementioned openings may be provided in the cooling chamber 350.

The application/development module 400 performs a process of applying a photoresist onto a substrate W before an exposure process and a process of developing the substrate W after the exposure process. The application/development module 400 has a substantially rectangular parallelepiped shape. The application/development module 400 has an application module 401 and a development module 402. The application module 401 and the development module 402 may be disposed to be partitioned from each other in different layers. According to an example, the application module 401 is situated on the development module 402.

The application module 401 performs a process of applying a photosensitive liquid such as a photoresist onto a substrate W and a heat treating process of, for example, heating and cooling the substrate W before and after the resist applying process. The application module 401 has a resist applying chamber 410, a bake chamber 420, and a carrying chamber 430. The resist applying chamber 410, the bake chamber 420, and the carrying chamber 430 are sequentially disposed along the second direction 14. Accordingly, the resist applying chamber 410 and the bake chamber 420 are spaced apart from each other in the second direction 14 while the carrying chamber 430 is interposed therebetween. A plurality of resist applying chambers 410 may be provided, and a plurality of resist applying chambers 410 may be provided in each of the first direction 12 and the third direction 16. In the drawings, six resist applying chambers 410 are illustrated as an example. A plurality of bake chamber 420 may be provided in each of the first direction 12 and the third direction 16. In the drawings, six bake chambers 420 are illustrated as an example. However, unlike this, a larger number of bake chambers 420 may be provided.

The carrying chamber 430 is situated in parallel to the first buffer 320 of the first buffer module 300 in the first direction 12. An application robot 432 and a guide rail 433 may be situated in the carrying chamber 430. The carrying chamber 430 has a substantially rectangular shape. The application robot 432 feeds a substrate W between the bake chambers 420, the resist applying chambers 400, the first buffer 320 of the first buffer module 300, and the first cooling chamber 520 of the second buffer module 500. The guide rail 433 is disposed such that the lengthwise direction thereof is parallel to the first direction 12. The guide rail 433 guides the application robot 432 such that the application robot 432 is linearly moved in the first direction 12. The application robot 432 has a hand 434, an arm 435, a support 436, and a prop 437. The hand 434 is fixedly installed in the arm 435. The arm 435 has a flexible structure such that the hand 434 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

The resist applying chambers 410 have the same structure. However, the types of photoresists used in the resist applying chambers 410 may be different. As an example, the photoresist may be a chemical amplification resist. The resist applying chamber 410 applies a photoresist onto the substrate W. The resist applying chamber 410 has a housing 411, a support plate 412, and a nozzle 413. The housing 411 has an open-topped cup shape. The support plate 412 is situated in the housing 411, and supports the substrate W. The support plate 412 may be provided to be rotatable. The nozzle 413 supplies a photoresist onto the substrate W positioned on the support plate 412. The nozzle 413 has a circular pipe shape, and may supply a photoresist to the center of the substrate W. Optionally, the nozzle 413 may have a length corresponding to the diameter of the substrate W, and the discharge hole of the nozzle 413 may be a slit. Further, additionally, a nozzle 414 for supplying a cleaning liquid such as deionized water to clean a surface of the substrate W, to which the photoresist is applied, may be further provided in the resist applying chamber 410.

The bake chamber 420 heat-treats the substrate W. For example, the bake chambers 420 perform a prebake process of eliminating organic substances and moisture on the surface of the substrate W by heating the substrate W at a predetermined temperature before a photoresist is applied or a soft bake process performed after a photoresist is applied onto the substrate W, and performs a cooling process of cooling the substrate W after the heating processes. The bake chamber 420 has a cooling plate 421 and a heating plate 422. The cooling plate 421 is provided with a cooling unit 423 such as cooling water or a thermoelectric element. The heating plate 422 is provided with a heating unit 424 such as a heating wire or a thermoelectric element. The cooling plate 421 and the heating plate 422 may be provided in one bake chamber 420. Optionally, some of the bake chambers 420 may include only a cooling plate 421, and some of the bake chambers 422 may include only a heating plate 472.

The development module 402 includes a process of eliminating a photoresist by supplying a development liquid to obtain a pattern on the substrate W, and a heat treating process, such as heating and cooling, which are performed on the substrate W before and after the development process. The development module 402 has a development chamber 800, a bake chamber 470, and a carrying chamber 480. The development chamber 800, the bake chamber 470, and the carrying chamber 480 are sequentially disposed along the second direction 14. Accordingly, the development chamber 800 and the bake chamber 470 are spaced apart from each other in the second direction 14 while the carrying chamber 480 is interposed therebetween. A plurality of development chambers 800 may be provided, and a plurality of development chambers 800 may be provided in each of the first direction 12 and the third direction 16. In the drawings, six development chambers 800 are illustrated as an example. A plurality of bake chamber 470 may be provided in each of the first direction 12 and the third direction 16. In the drawings, six bake chambers 470 are illustrated as an example. However, unlike this, a larger number of bake chambers 470 may be provided.

The carrying chamber 480 is situated in parallel to the second buffer 330 of the first buffer module 300 in the first direction 12. A development robot 482 and a guide rail 483 may be situated in the carrying chamber 480. The carrying chamber 480 has a substantially rectangular shape. The development robot 482 feeds the substrate W between the bake chambers 470, the development chambers 800, the second buffer 330 and the cooling chamber 350 of the first buffer module 300, and the second cooling chamber 540 of the second buffer module 500. The guide rail 483 is disposed such that the lengthwise direction thereof is parallel to the first direction 12. The guide rail 483 guides the development robot 482 such that the development robot 432 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The development chambers 800 have the same structure. However, the types of development liquids used in the development chambers 800 may be different. The development chambers 800 are provided as an apparatus for development a substrate. The development chambers 800 eliminate an area of the photoresist on the substrate W, to which light is irradiated. Then, an area of the protective film, to which light is irradiated, is eliminated together. Optionally, only an area of the photoresist and the protective film, to which light is not irradiated, may be eliminated according to the type of the used photoresist.

Figure 6:
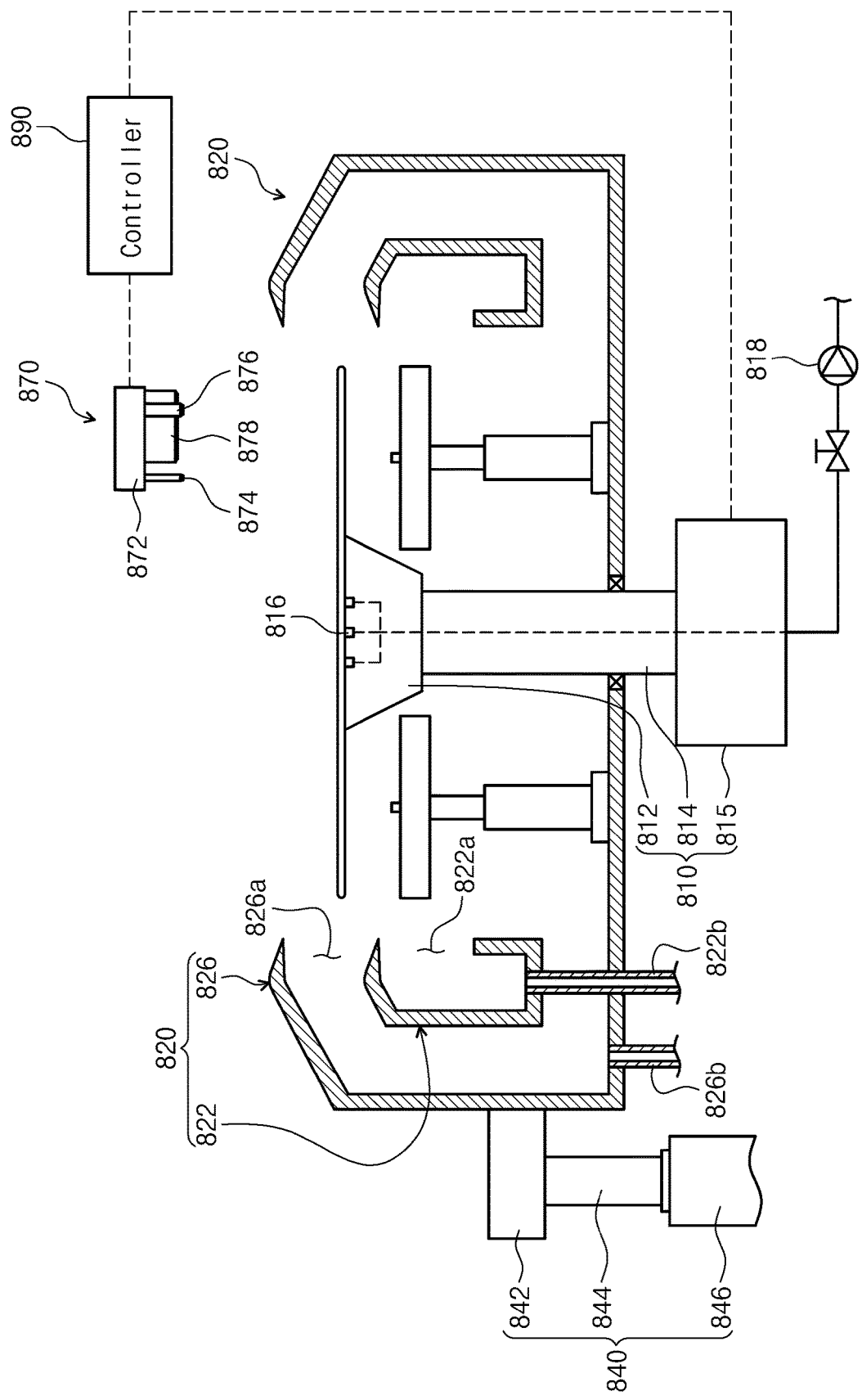
FIG. 6 is a sectional view illustrating the substrate treating apparatus of FIG. 2.
Figure 7:
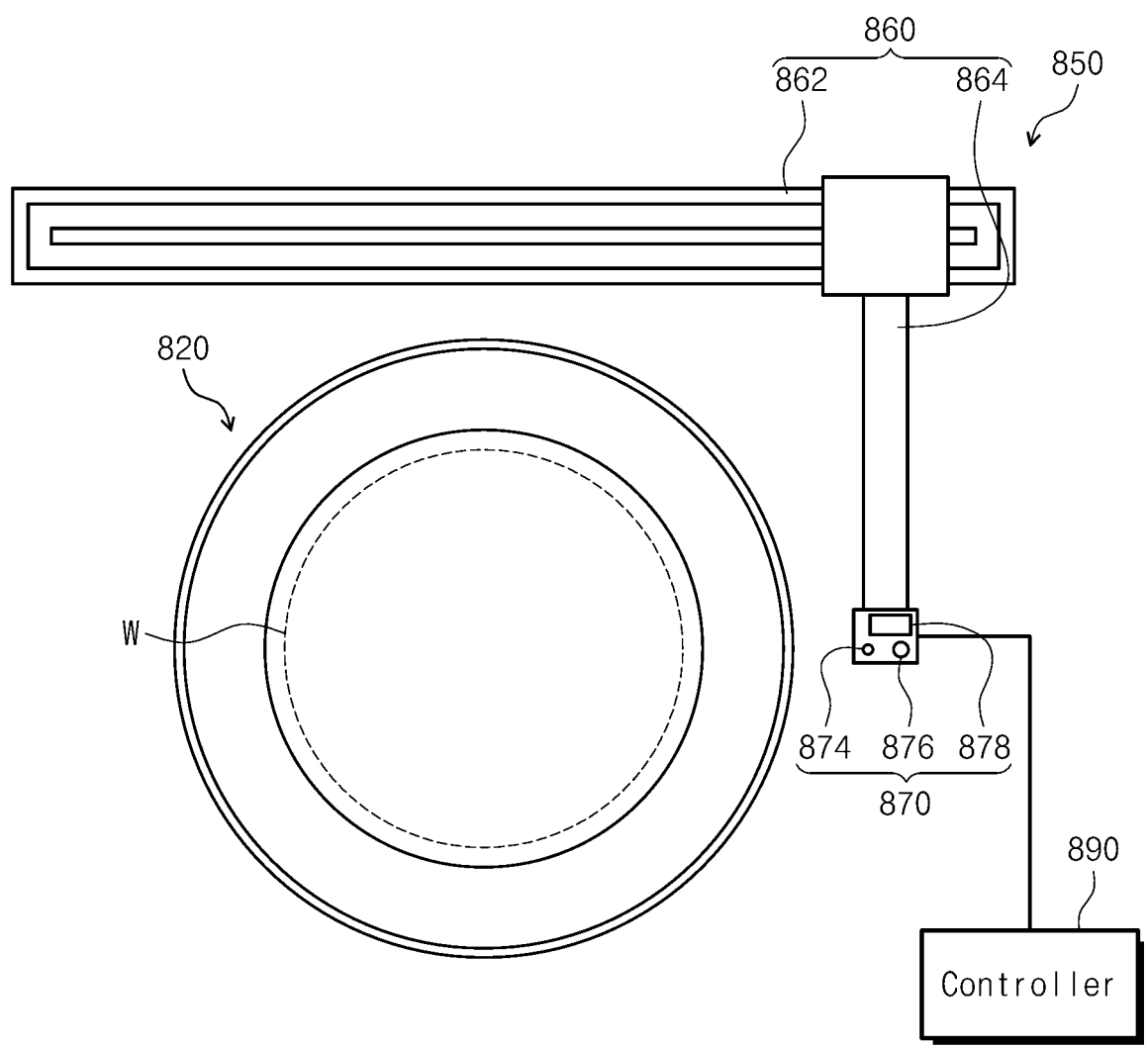
FIG. 7 is a plan view illustrating the substrate treating apparatus of FIG. 6.

In the embodiment, the development chambers 800 are provided as the substrate treating apparatus 800 for liquid-treating the substrate W. FIG. 6 is a sectional view illustrating the substrate treating apparatus of FIG. 2. FIG. 7 is a plan view illustrating the substrate treating apparatus of FIG. 6. Referring FIGS. 6 and 7, the substrate treating apparatus 800 includes a substrate support unit 810, a treatment container 820, an elevation unit 840, a liquid supply unit 850, a heating unit 900, and a controller 890.

The substrate supporting unit 810 supports and rotates the substrate W. The substrate support unit 810 includes a support plate 812, rotation driving members 814 and 815, and a vacuum member 818. The support plate 812 supports the substrate. The support plate 812 has a circular disk shape. A diameter of an upper surface of the support plate 812 is larger than that of a lower surface of the support plate 812. A side surface connecting the upper surface and the lower surface of the support plate 812 may face a downwardly inclined direction as it goes toward a central axis of the support plate 812. The upper surface of the support plate 812 is provided as a seating surface, on which the substrate W is seated. The seating surface has an area that is smaller than the substrate W. A plurality of suction holes 816 are formed on the seating surface. The suction hole 816 may be a hole 816 for suctioning the substrate seated on the seating surface by reducing the pressure of the substrate. The vacuum member 818 is connected to the suction hole 816. According to an example, the diameter of the seating surface may be smaller than the radius of the substrate W. The vacuum member 818 may be a pump that reduces a pressure of the suction hole 816.

The rotation driving member 814 and 815 rotate the support plate 812. The rotation driving members 814 and 815 include a rotary shaft 814 and a driver 815. The rotary shaft 814 is provided such that a lengthwise direction of the rotary shaft 814 has a container shape facing a vertical direction. The rotary shaft 814 is coupled to a bottom surface of the support plate 812. The driver 815 transmits a rotational force to the rotary shaft 814. The rotary shaft 814 may be rotated about the central axis thereof by a rotational force provided by the driver 815. The support plate 812 may be rotated together with the rotary shaft 814. A rotational speed of the rotary shaft 814 is adjusted by the driver 815 so that a rotational speed of the substrate W may be adjusted. For example, the driver 815 may be a motor.

The treatment container 820 has a treatment space, in which a development process is performed, in the interior thereof. The treatment container 820 recovers a liquid used in the development process. The treatment container 820 has an open-topped cup shape. The treatment container 820 includes an inner recovery vessel 822 and an outer recovery vessel 826. The recovery vessels 822 and 826 recover different treatment liquids used in the process. The inner recovery vessel 822 is provided to have an annular ring shape that surrounds the substrate support member 810, and the outer recovery vessel 826 is provided to have an annular ring shape that surrounds the inner recovery vessel 822. An inner space 822a of the inner recovery vessel 822 and a space 826a between the outer recovery vessel 826 and the inner recovery vessel 822 functions as inlets, through which the liquid is introduced into the inner recovery vessel 822 and the outer recovery vessel 826, respectively. Recovery lines 822b and 826b extending from the recovery vessels 822 and 826 perpendicularly in the downward direction of the bottom surfaces thereof are connected to the recovery vessels 822 and 826, respectively. The recovery lines 822b and 826b discharge the liquids introduced through the recovery vessels 822 and 826, respectively. The discharged liquids may be reused through an external treatment liquid recycling system (not illustrated).

The elevation unit 840 adjusts a relative height between the container 820 and the substrate support unit 810. The elevation unit 840 moves the container 820 upwards and downwards. The elevation unit 840 includes a bracket 842, a movable shaft 844, and a driver 846. The bracket 842 connects the treatment container 820 and the movable shaft 844. The bracket 842 is fixedly installed in the vertical wall 822 of the treatment container 820. The movable shaft 844 is provided such that a lengthwise direction of the movable shaft 844 faces a vertical direction. An upper end of the movable shaft 844 is fixedly coupled to the bracket 842. The movable shaft 844 may be moved vertically by the driver 846, and the treatment space 820 may be elevated together with the movable shaft 844. For example, the driver 846 may be a cylinder or a motor.

The liquid supply unit 850 supplies a liquid onto the substrate W supported by the substrate support unit 810. The liquid supply unit 850 includes a nozzle moving member 860, a nozzle unit 870, and a cleaning nozzle 880. The nozzle moving member 860 moves the nozzle unit 870 to a process location and a standby location. Here, the process location is a location at which the nozzle units 870 face the substrate W vertically, and the standby location is a location deviating from the process location. The nozzle moving member 860 linearly moves the nozzle unit 870. According to an example, the nozzle unit 870 may be linearly moved in a first direction 12.

The nozzle moving member 860 includes a guide rail 862 and a support arm 864. The guide rail 862 is situated on one side of the treatment container. The guide rail 862 is provided such that a lengthwise direction of the guide rail 862 is parallel to the movement directions of the nozzle units 870 and 880. For example, a lengthwise direction of the guide rail 862 may be provided to face the first direction 12. The support arm 864 has a bar shape. When viewed from the top, a lengthwise direction of the support arm 864 is perpendicular to the guide rail 862. For example, a lengthwise direction of the support arm 864 may face the second direction 14. The nozzle unit 870 is coupled to one end of the support arm 864. An opposite end of the support arm 864 is installed in the guide rail 862. Accordingly, the support arm 864 and the nozzle unit 870 may move together along the lengthwise direction of the guide rail 862.

Figure 8:
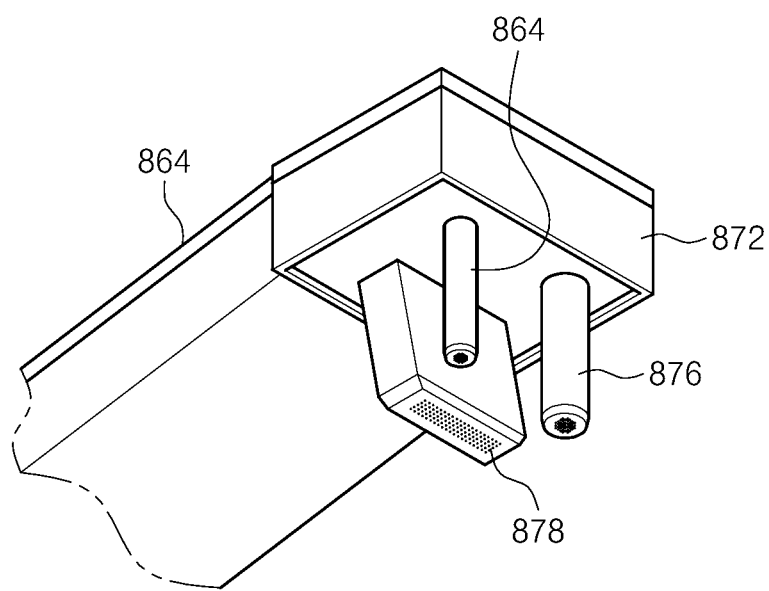
FIG. 8 is a perspective view illustrating a treatment nozzle unit of FIG. 6.

The nozzle unit 870 discharges a treatment liquid and a rinsing liquid. FIG. 8 is a perspective view illustrating a nozzle unit of FIG. 6; Referring to FIG. 8, the nozzle unit 870 includes a body 872, a rinsing nozzle 874, a first treatment nozzle 876, and a second treatment nozzle 878. The treatment body 872 supports the rinsing nozzle 874, the second treatment nozzle 878, and the first treatment nozzle 876. The body 872 is fixedly coupled to a bottom surface of one end of the support arm 864. The rinsing nozzle 874, the first treatment nozzle 876, and the second treatment nozzle 878 are fixedly coupled to the bottom surface of the body 872.

The first treatment nozzle 876 discharges the treatment liquid in a stream manner. The first treatment nozzle 876 has a circular stream outlet. The stream outlet faces a vertically downward direction.

The second treatment nozzle 878 discharges the treatment liquid in a liquid curtain manner. The treatment nozzle 878 has a slit outlet. The slit outlet has a lengthwise direction that is parallel to the guide rail 862. The slit outlet may have a lengthwise direction that faces the first direction 12. The slit outlet faces a downwardly inclined direction. The second treatment nozzle 878 may be downwardly inclined such that a liquid is discharged to the same point as the first treatment nozzle 876. The slit outlet has a length that is smaller than the radius of the substrate W. According to an embodiment, the slit outlet may face a downwardly inclined direction as it goes from the second treatment nozzle 878 toward the first treatment nozzle 876. The second treatment nozzle 878 is located on one side of the first treatment nozzle 876. The second treatment nozzle 878 is located to be opposite to the first treatment nozzle 876. When viewed from the top, the second treatment nozzle 878 and the first treatment nozzle 876 may be arranged along the second direction 14. For example, the treatment liquid discharged from the second treatment nozzle 878 and the first treatment nozzle 876 may be of the same kind. The treatment liquid may be a development liquid.

The rinsing nozzle 874 discharges a wetting liquid in a stream manner. The rinsing nozzle 874 is located to be adjacent to the first treatment nozzle 876 and the second treatment nozzle 878. When viewed from the top, the rinsing nozzle 874 and the first treatment nozzle 878 may be arranged along the first direction 12. The rinsing nozzle 874 has a circular stream outlet. The stream outlet faces a vertically downward direction. For example, the rinsing liquid may be pure water (DIW).

The cleaning nozzle 880 supplies a cleaning liquid onto a bottom surface of the substrate W. The cleaning nozzle 880 may be elevated by an elevation member 916 of the heating unit 900. The cleaning nozzle 880 is installed on an upper surface of a heating plate 912 of the heating unit 900. An outlet of the cleaning nozzle 880 faces a vertically upward direction. The cleaning nozzle 880 supplies a cleaning liquid to a peripheral area of a bottom surface of the substrate W. For example, the cleaning liquid may be the same liquid as the rinsing liquid. The cleaning liquid may be pure water (DIW). Optionally, the outlet of the cleaning nozzle 880 may face an upwardly inclined direction.

Figure 9:
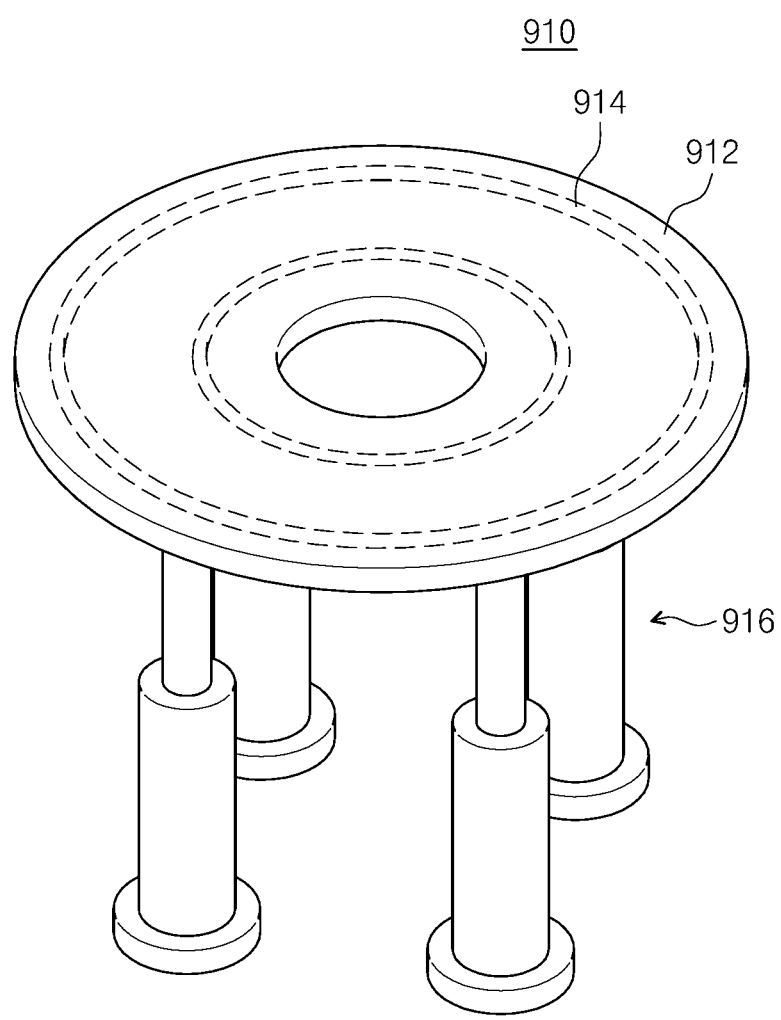
FIG. 9 is a perspective view illustrating a first heating member of FIG. 6.

The heating unit 900 heats the substrate W. The heating unit 900 includes a first heating member 910 and a second heating member 930. The first heating member 910 heats the first area A of the substrate W. According to an embodiment, the first area A may be a peripheral area. The first area A may be an area that does not correspond to the seating surface. The first heating member 910 is located below the substrate W. FIG. 9 is a perspective view illustrating a first heating member 910 of FIG. 6. Referring to FIG. 9, the first heating member 910 includes a heating plate 912, a first heater 914, and an elevation member 916. The heating plate 912 has an annular ring shape that surrounds a circumference of the support plate 812. The heating plate 912 may have an outer diameter that is the same as or larger than the outer diameter of the substrate W. Further, the heating plate 912 may have an inner diameter that is the same as or larger than a diameter of a bottom surface of the support plate 812. A first heater 914 is provided in the heating plate 912. Like the heating plate 912, the first heater 914 has an annular ring shape. The heating plate 912 faces the first area A of the substrate W vertically. That is, the heating plate 912 heats the first area A below the substrate W.

The elevation member 916 adjusts a relative height between the heating plate 912 and the substrate W. The elevation member 916 elevates one of the heating plate 912 and the substrate W. In the embodiment, it will be described that the elevation member 916 elevates the heating plate 912. The elevation member 916 moves the heating plate 912 such that an interval between the heating plate 912 and the support plate 812 becomes a first interval D1 or a second interval D2. the second interval D2 is defined as an interval that is smaller than the first interval D1. According to an example, the heating plate 912 and the substrate W are moved to a first location such that the interval between the heating plate 912 and the support plate 812 becomes the first interval D1, and are moved to a second location such that the interval between the heating plate 912 and the support plate 812 becomes the second interval D2. The second location may be a location that is adjacent to the substrate W such that the first heater 914 heats the substrate W. For example, the elevation member 916 may be one or a plurality of cylinders.

Referring to FIGS. 6 and 7 again, the second heating member 930 heats a second area B of the substrate W that is different from the first area A. According to an example, the second area B may be a central area. The second area B may be an area corresponding to the seating surface. The second heating member 930 is located above the substrate W. The second heating member 930 includes a second heater 932 and a movable member 934. The second heater 932 has a circular plate shape. The second heater 932 has a diameter that is the same as or smaller than the diameter of the seating surface of the support plate 812. For example, the second heating member 930 may have a temperature that is the same as the temperature of the heating member 910. When the area A of the substrate W is a portion of the entire area, the second area B may be the remaining area.

The movable member 934 moves the second heater 932 to a heating location and a standby location. The movable member 934 includes a horizontal arm. The horizontal arm supports the second heater 932. The horizontal arm may be swung by a driving member (not illustrated). The horizontal arm moves the second heater 932 to a heating location facing the substrate W and a standby location deviating from the heating location. the heating location is a location at which the second heater 932 heats the second area B of the substrate W, and the standby location is a location at which the substrate W is not heated. The second location is a location at which the second heater 932 and the second area B face each other vertically. At the heating location, an interval D3 between the second heater 932 and the second area B may be the same as the second interval D2. Accordingly, the first area A and the second area B may be heated to the same temperature.

The controller 890 controls the liquid supply unit 850 and the heating unit 900. The controller 890 controls the liquid supply unit 850 such that the treatment liquid and the rinsing liquid may be sequentially supplied onto the substrate W. The controller 890 controls the liquid supply unit 850 such that the cleaning liquid may be supplied to a bottom surface of the substrate W while the treatment liquid and the rinsing liquid are supplied onto the substrate W. If the supply of the rinsing liquid is completed, the controller 890 stops supply of the liquid to the substrate W and performs a drying process of the substrate W. According to an embodiment, the substrate W is rotated at a treatment speed V1 while the treatment liquid is supplied onto the substrate W, the substrate W is rotated at a rinsing speed V2 while the rinsing liquid is supplied, and the substrate W is rotated at a drying speed V3 in the drying process. The drying speed V3 may be a speed that is lower than the treatment speed V1 and the rinsing speed V2.

Figure 10:
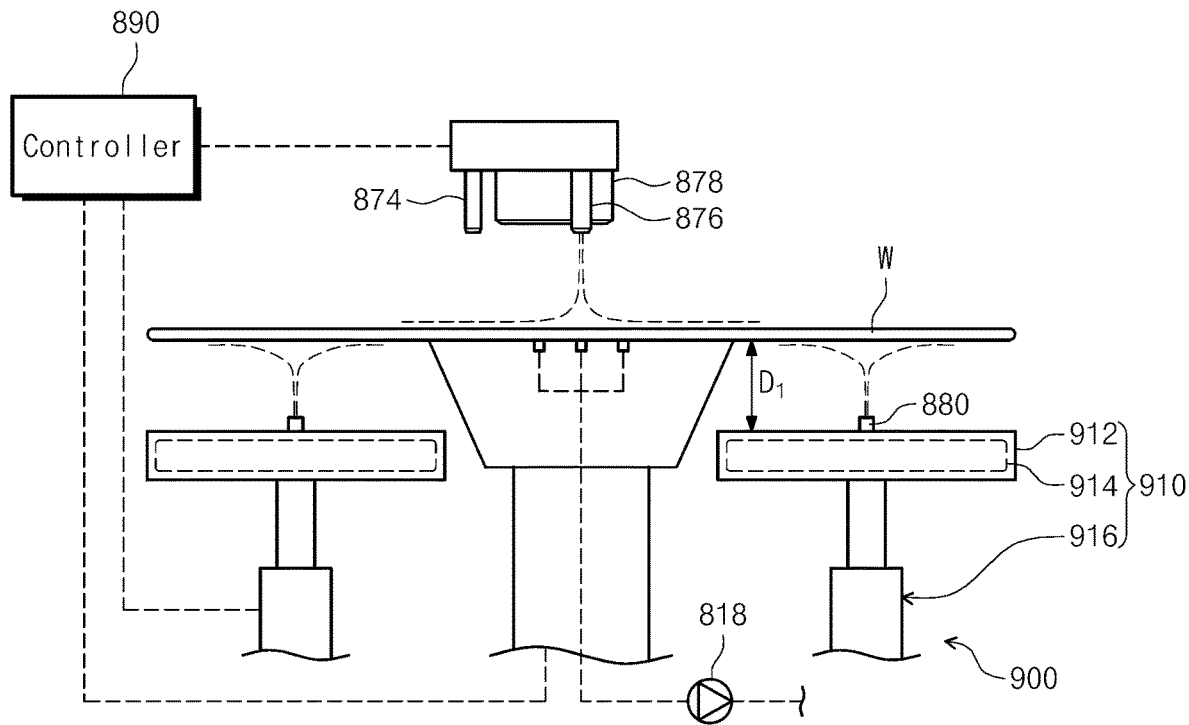
FIGS. 10 to 12 are views illustrating a process of treating a substrate by using the apparatus of FIG. 6.
Figure 11:
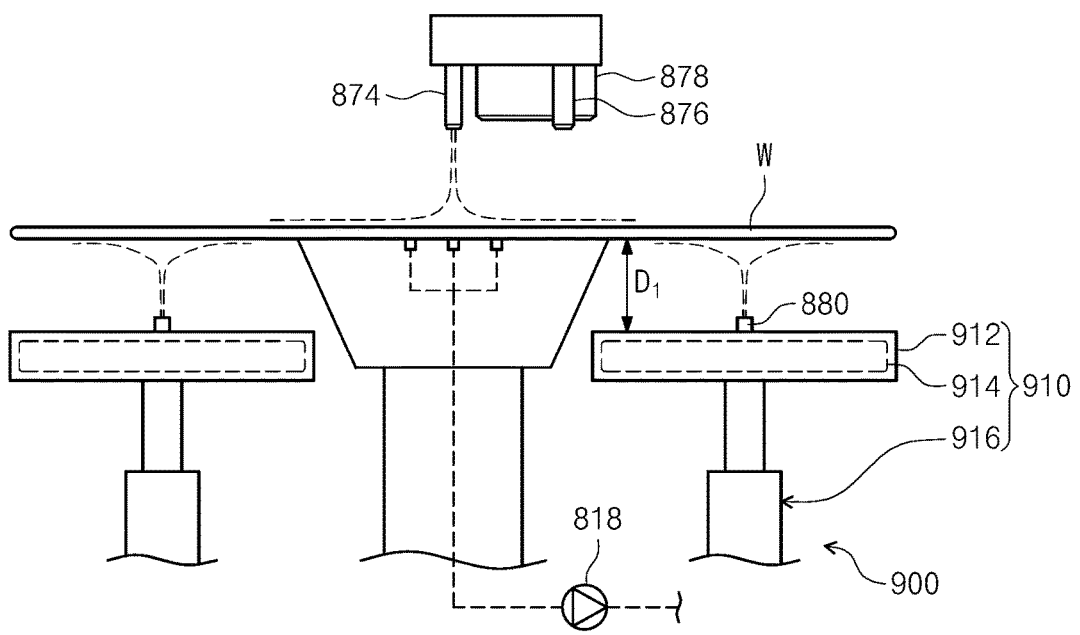
Figure 12:
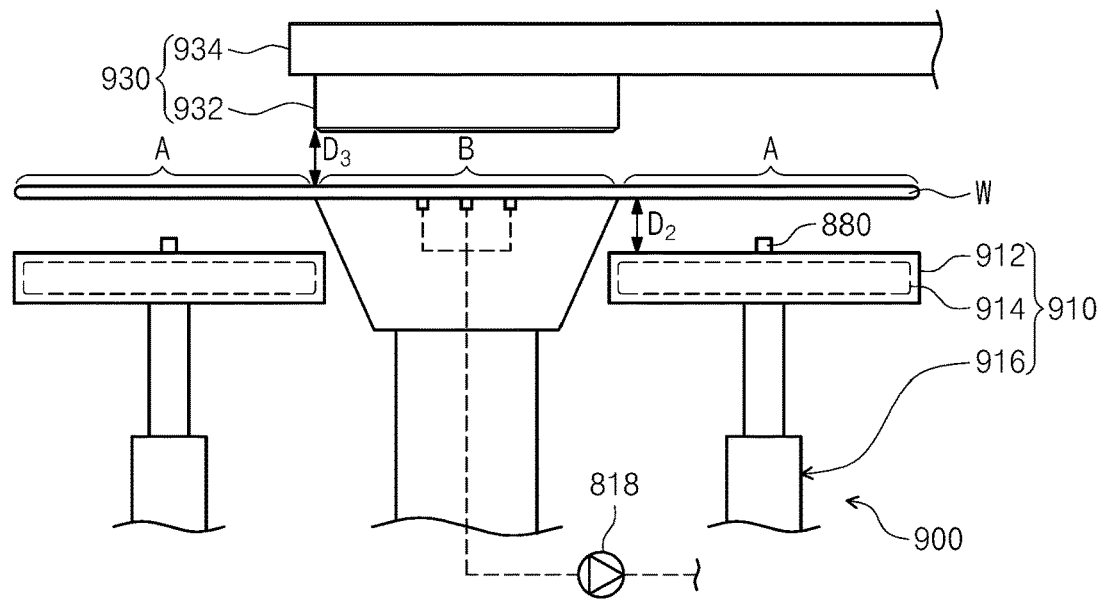
Figure 13:
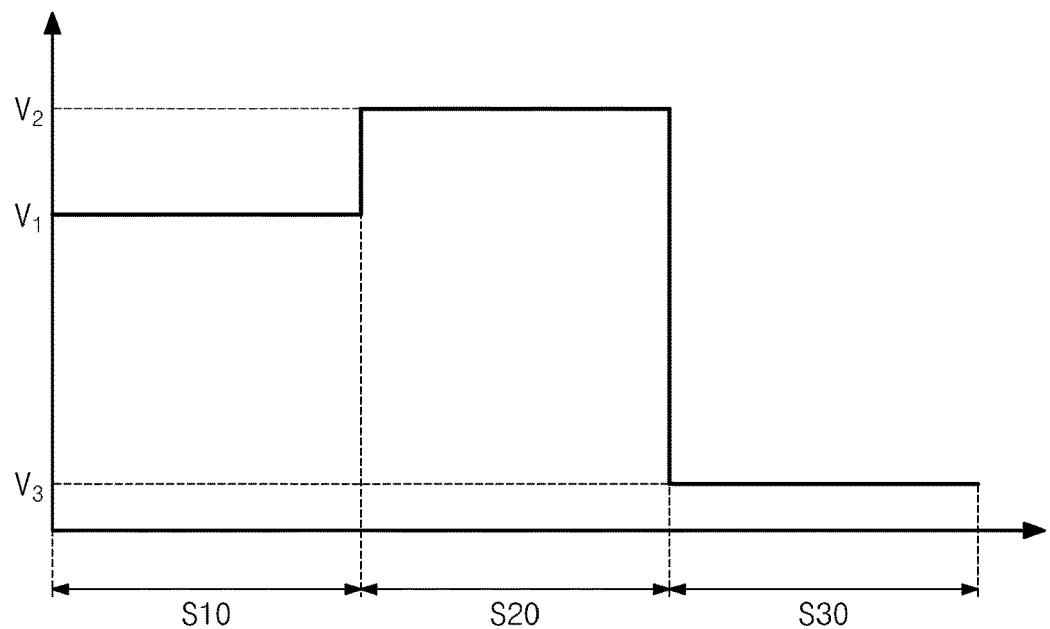
FIG. 13 is a graph illustrating a rotational speed of the substrate according to FIGS. 10 to 12.

Next, a method for treating a substrate W by using the aforementioned substrate treating apparatus will be described. FIGS. 10 to 12 are views illustrating a process of treating a substrate by using the apparatus of FIG. 6. FIG. 13 is a graph illustrating a rotational speed of the substrate according to FIGS. 10 to 12. Referring to FIGS. 10 to 13, the method for treating the substrate W includes a liquid supplying operation and a drying operation S30. The liquid supplying operation includes a treatment liquid supplying operation S10 and a rinsing liquid supplying operation S20. The treatment liquid supplying operation S10, the rinsing liquid supplying operation S20, and the drying operation S30 are sequentially performed. If the treatment liquid supplying operation S10 is performed, the substrate W is rotated at the treatment speed V1 and the treatment liquid is supplied to the upper surface of the substrate W. The cleaning nozzle 880 supplies the cleaning liquid to the bottom surface of the substrate W at a first location at which the interval between the heating plate 912 and the substrate W is the first interval D1. The cleaning liquid may be a liquid heated by the first heater 914. The cleaning liquid may clean the bottom surface of the substrate W and adjust the temperature of the substrate W to a process temperature at the same time. If the treatment liquid supplying operation S10 is completed, the supply of the treatment liquid is stopped.

If the rinsing liquid supplying operation S20 is performed, the substrate W is rotated at the rinsing speed V1 and the rinsing liquid is supplied to the upper surface of the substrate W. The rinsing liquid rises the treatment liquid residing on the substrate W. The cleaning liquid is supplied to the bottom surface of the substrate W. The cleaning liquid may be a liquid heated by the first heater 914. The cleaning nozzle 880 supplies the cleaning liquid to the bottom surface of the substrate W at a first location at which the interval between the heating plate 912 and the substrate W is the first interval D1. The rinsing speed V2 may be a speed that is higher than the treatment speed V1. If the rinsing liquid supply operation S20 is completed, the supply of the rinsing liquid and the cleaning liquid is stopped. The treatment liquid may be recovered to an external recovery vessel 826, and the rinsing liquid may be recovered to an inner recovery vessel 822.

If the drying operation S30 is performed, the substrate W is rotated at the drying speed V3. The heating plate 912 is moved to the first location such that the interval between the heating plate 912 and the substrate W becomes the first interval D1, and the second heater 932 is moved to the heating location. The first heater 914 heats the first area A of the substrate W, and the second heater 932 heats the second area B of the substrate W. The first heating member 910 and the second heating member 930 heats the areas to the same temperature. The interval D3 between the second heater 932 and the second area B may be the same as the second interval D2. The drying speed V3 may be 20 RPM or less.

Optionally, the operation may heat the first area A and the second area B to different temperatures by adjusting the second interval D2.

In the above-mentioned embodiment, the substrate W is rotated slower in the drying operation S30 that in the treatment supplying operation S10 and the rinsing liquid supplying operation S20. Accordingly, in the process of vaporizing the rinsing liquid, collapses of the patterns formed on the substrate W may be reduced. In addition, the first area A of the substrate W is heated by the first heating member 910 and the second area B of the substrate W is heated by the second heating member 930. Accordingly, the drying efficiency of the substrate W may be improved.

Figure 14:
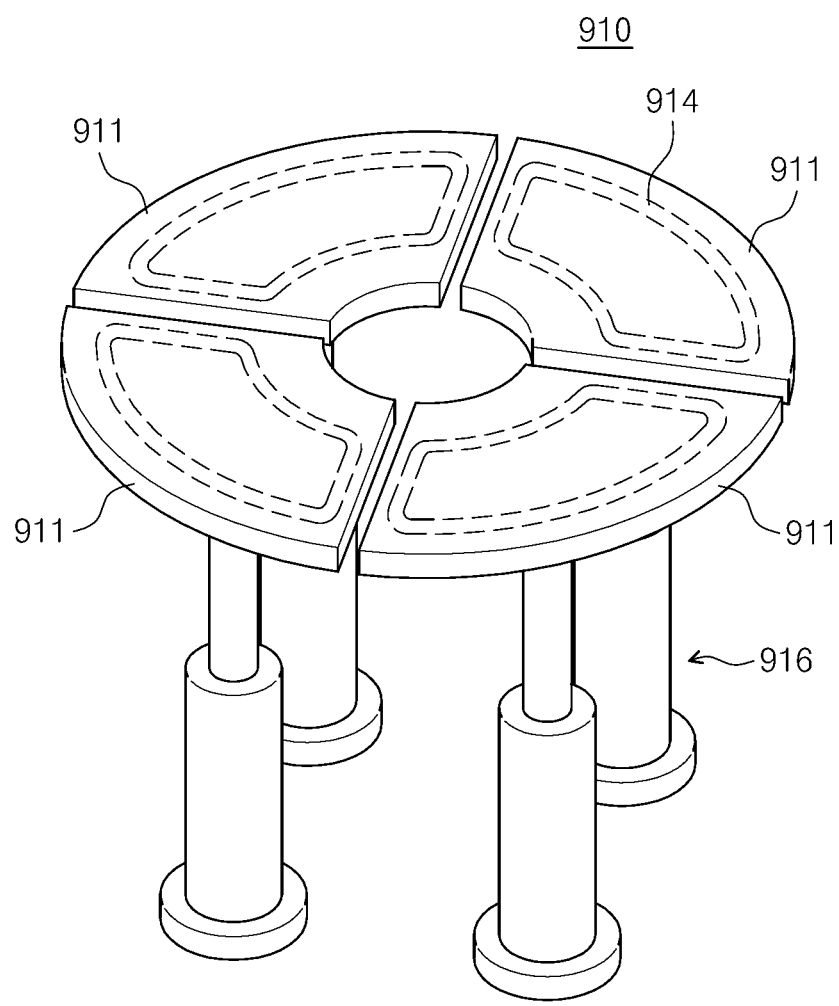
FIG. 14 is a perspective view illustrating another embodiment of a first heating member of FIG. 9.

In the above-mentioned embodiment, it has been described that the first heating member 910 has a single heating plate 912 and the heating plate 912 has an annular ring shape. However, as illustrated in FIG. 14, a plurality of heating plates 912 may be provided. The heating plates 911 have an arc shape, and may be arranged along a circumferential direction of the support plate 812. The heating plates 911 may be combined with each other to have an annular ring shape. A first heater 914 may be provided to each of the heating plates 911. The heating plates 911 may be elevated by the elevation member 916 at the same time.

Referring to FIGS. 2 to 5 again, the bake chamber 470 of the development module 402 heats the substrate W. For example, the bake chambers 470 may perform a post bake process of heating the substrate W before the development process, a hard bake process of heating the substrate W after the development process, and a cooling process of cooling the heated substrate W after the bake process. The bake chamber 470 has a cooling plate 471 and a heating plate 472. The cooling plate 471 is provided with a cooling unit 473 such as cooling water or a thermoelectric element. The heating plate 472 is provided with a heating unit 474 such as a heating wire or a thermoelectric element. The cooling plate 471 and the heating plate 472 may be provided in one bake chamber 470. Optionally, some of the bake chambers 470 may include only a cooling plate 471, and some of the bake chambers 470 may include only a heating plate 472.

As described above, the application/development module 400 is provided such that the application module 401 and the development module 402 are separated. When viewed from the top, the application module 401 and the development module 402 may have the same chamber disposition.

The second buffer module 500 is provided as a passage through which the substrate W is transported, between the application/development module 400 and the pre/post-exposure module 600. The second buffer module 500 performs a process such as a cooling process or an edge exposing process on the substrate W. The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the application module 401. The second cooling chamber 540 is disposed at a height corresponding to the development module 402. The buffer 520, the first cooling chamber 530, and the second cooling chamber 540 are disposed in a row along the third direction 16. When viewed from the top, the buffer 520 is disposed along the carrying chamber 430 of the application module 401 in the first direction 12. The edge exposing chamber 550 is spaced apart from the buffer 520 or the first cooling chamber 530 by a predetermined distance in the second direction 14.

The second buffer robot 560 transports the substrate W between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 perform a succeeding process on the substrates W, on which the application module 401 has performed a process. The first cooling chamber 530 cools the substrate W, on which the application module 401 has performed a process. The first cooling chamber 530 has a structure similar to that of the cooling chamber 350 of the first buffer module 300. The edge exposing chamber 550 exposes peripheries of the substrates W, on which the first cooling chamber 530 has performed a cooling process. The buffer 520 temporarily preserves the substrates W before the substrates W, on which the edge exposing chamber 550 has performed a process, are transported to a pre-treatment module 601, which will be described below. The second cooling chamber 540 cools the substrates W before the substrates W, on which a post-treatment module 602, which will be described below, has performed a process, are transported to the development module 402. The second buffer module 500 may further have a buffer at a height corresponding to the development module 402. In this case, the substrates W, on which the post-treatment module 602 has performed a process, may be transported to the development module 402 after being temporarily preserved in the added buffer.

When the exposure apparatus 900 performs an immersion/exposure process, the pre/post-exposure module 600 may perform a process of applying a protective film that protects the photoresist film applied to the substrate W during the immersion/exposure process. The pre/post-exposure module 600 may perform a process of cleaning the substrate W after the exposure process. Furthermore, when the application process is performed by using a chemical amplification resist, the pre/post-exposure module 600 may perform a bake process after the exposure process.

The pre/post-exposure module 600 has a pre-treatment module 601 and a post-treatment module 602. The pre-treatment module 601 performs a process of treating the substrate W before the exposure process, and the post-treatment module 602 performs a process of treating the substrate W after the exposure process. The pre-treatment module 601 and the post-treatment module 602 may be disposed to be partitioned from each other in different layers. According to an example, the pre-treatment module 601 is situated on the post-treatment module 602. The pre-treatment module 601 has the same height as that of the application module 401. The post-treatment module 602 has the same height as that of the development module 402. The pre-treatment module 601 has a protective film applying chamber 610, a bake chamber 620, and a carrying chamber 630. The protective film applying chamber 610, the carrying chamber 630, and the bake chamber 620 are sequentially disposed along the second direction 14. Accordingly, the protective film applying chamber 610 and the bake chamber 620 are spaced apart from each other in the second direction 14 while the carrying chamber 630 is interposed therebetween. A plurality of protective film applying chambers 610 are provided, and the plurality of protective film applying chambers 610 are disposed along the third direction 16 to form different layers. Optionally, a plurality of protective film applying chambers 610 may be provided in each of the first direction 12 and the third direction 16. A plurality of bake chambers 620 are provided, and the plurality of bake chambers 610 are disposed along the third direction 16 to form different layers. Optionally, a plurality of bake chambers 620 may be provided in each of the first direction 12 and the third direction 16.

The carrying chamber 630 is situated in parallel to the first cooling chamber 530 of the second buffer module 500 in the first direction 12. A pre-treatment robot 632 is situated in the carrying chamber 630. The carrying chamber 630 has a substantially square or rectangular shape. The pre-treatment robot 632 feeds the substrate W between the protective film applying chambers 610, the bake chambers 620, the buffer 520 of the second buffer module 500, and a first buffer 720 of the interface module 700, which will be described below. The pre-treatment robot 632 has a hand 633, an arm 634, and a support 635. The hand 633 is fixedly installed in the arm 634. The arm 634 has a flexible and rotatable structure. The arm 634 is coupled to the support 635 to be linearly movable in the third direction 16 along the support 635.

The protective film applying chamber 610 applies a protective film that protects a resist film during the immersion/exposure process, onto the substrate W. The protective film applying chamber 610 has a housing 611, a support plate 612, and a nozzle 613. The housing 611 has an open-topped cup shape. The support plate 612 is situated in the housing 611, and supports the substrate W. The support plate 612 may be provided to be rotatable. The nozzle 613 supplies a protection liquid for forming a protective film onto the substrate W positioned on the support plate 612. The nozzle 613 has a circular pipe shape, and may supply a protection liquid to the center of the substrate W. Optionally, the nozzle 613 may have a length corresponding to the diameter of the substrate W, and the discharge hole of the nozzle 613 may be a slit. In this case, the support plate 612 may be provided in a fixed state. The protection liquid includes an expandable material. The protection liquid may be a material that has a low affinity for a photoresist and water. For example, the protection liquid may include a fluorine-based solvent. The protective film applying chamber 610 supplies a protection liquid to a central area of the substrate W while rotating the substrate W positioned on the support plate 612.

The bake chamber 620 heat-treats the substrate W, to which the protective film is applied. The bake chamber 620 has a cooling plate 621 and a heating plate 622. The cooling plate 621 is provided with a cooling unit 623 such as cooling water or a thermoelectric element. The heating plate 622 is provided with a heating unit 624 such as a heating wire or a thermoelectric element. The heating plate 622 and the cooling plate 621 may be provided in one bake chamber 620. Optionally, some of the bake chambers 620 may include only a heating plate 622, and some of the bake chambers 620 may include only a cooling plate 621.

The post-treatment module 602 has a cleaning chamber 660, a post-exposure bake chamber 670, and a carrying chamber 680. The cleaning chamber 660, the carrying chamber 680, and the post-exposure chamber 670 are sequentially disposed along the second direction 14. Accordingly, the cleaning chamber 660 and the post-exposure bake chamber 670 are spaced apart from each other in the second direction 14 while the carrying chamber 680 is interposed therebetween. A plurality of cleaning chambers 660 are provided, and the plurality of cleaning chambers 610 are disposed along the third direction 16 to form different layers. Optionally, a plurality of cleaning chambers 660 may be provided in each of the first direction 12 and the third direction 16. A plurality of post-exposure bake chambers 670 are provided, and the plurality of post-exposure bake chambers 610 are disposed along the third direction 16 to form different layers. Optionally, a plurality of post-exposure bake chambers 670 may be provided in each of the first direction 12 and the third direction 16.

When viewed from the top, the carrying chamber 680 is situated in parallel to the second cooling chamber 540 of the second buffer module 500 in the first direction 12. The carrying chamber 680 has a substantially square or rectangular shape. A post-treatment robot 682 is situated in the carrying chamber 680. The post-treatment robot 682 transports the substrate W between the cleaning chambers 660, the post-exposure bake chambers 670, the second cooling chamber 540 of the second buffer module 500, and a second buffer 730 of the interface module 700, which will be described below. The post-treatment robot 682 provided in the post-treatment module 602 may have the same structure as that of the pre-treatment robot 632 provided in the pre-treatment module 601.

The cleaning chamber 660 cleans the substrate W after the exposure process. The cleaning chamber 660 has a housing 661, a support plate 662, and a nozzle 663. The housing 661 has an open-topped cup shape. The support plate 662 is situated in the housing 661, and supports the substrate W. The support plate 662 may be provided to be rotatable. The nozzle 663 supplies a cleaning liquid onto the substrate W positioned on the support plate 662. The cleaning liquid may be water such as deionized water. The cleaning chamber 660 supplies a cleaning liquid to a central area of the substrate W while rotating the substrate W positioned on the support plate 662. Optionally, the nozzle 663 may be linearly moved or rotated from a central area to a peripheral area of the substrate W while the substrate W is rotated.

After the exposure process, the bake chamber 670 heats the substrate W, on which the exposure process has been performed, by using a far infrared ray. After the exposure process, in the bake process, the substrate W is heated to finish a property change of the photoresist by amplifying acid produced in the photoresist through the exposure process. After the exposure process, the bake chamber 670 has a heating plate 672. The heating plate 672 is provided with a heating unit 674 such as a heating wire or a thermoelectric element. After the exposure process, the bake chamber 670 may be further provided with a cooling plate 671 in the interior thereof. The cooling plate 671 is provided with a cooling unit 673 such as cooling water or a thermoelectric element. Optionally, a bake chamber having only a cooling plate 671 may be further provided.

As described above, the pre/post-exposure module 600 is provided such that the pre-treatment module 601 and the post-treatment module 602 are completely separated from each other. The carrying chamber 630 of the pre-treatment module 601 and the carrying chamber 680 of the post-treatment module 602 may have the same size, and may completely overlap each other when viewed from the top. The protective film applying chamber 610 and the cleaning chamber 660 may have the same size, and may completely overlap with each other when viewed from the top. The bake chamber 620 and the post-exposure chamber 670 may have the same size, and may completely overlap with each other when viewed from the top.

The interface module 700 feeds the substrate W between the pre/post-exposure module 600 and the exposure apparatus 900. The interface module 700 has a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is situated at a height corresponding to the pre-treatment module 601, and the second buffer 730 is disposed at a height corresponding to the post-treatment module 602. When viewed from the top, the first buffer 720 is disposed along the first direction 12 while forming a row with the carrying chamber 630 of the pre-treatment module 601, and the second buffer 730 is disposed along the first direction 12 forming a row with the carrying chamber 630 of the post-treatment module 602.

The interface robot 740 is situated to be spaced apart from the first buffer 720 and the second buffer 730 in the second direction 14. The interface robot 740 transports the substrate W between the first buffer 720, the second buffer 730, and the exposure apparatus 900. The interface robot 740 has a structure that is substantially similar to that of the second buffer robot 560.

The first buffer 720 temporarily preserves the substrates W, on which the pre-treatment module 601 has performed a process, before they are moved to the exposure apparatus 900. The second buffer 730 temporarily preserves the substrates W, on which the exposure apparatus 900 has completely performed a process, before they are moved to the post-treatment module 602. The first buffer 720 has a housing 721 and a plurality of supports 722. The supports 722 are disposed within the housing 721, and are spaced apart from one another along the third direction 16. One substrate W is positioned on each of the supports 722. The housing 721 has openings (not illustrated) on a side on which the interface robot 740 is provided and on a side on which the pre-treatment robot 721 is provided so that the interface robot 740 and the pre-treatment robot 632 carry a substrate W into or out of the cooling plate 722. The second buffer 730 has a structure that is substantially similar to that of the first buffer 720. Meanwhile, the housing 731 of the second buffer 730 has openings on a side on which the interface robot 740 is provided and on a side on which the post-treatment robot 682 is provided. The interface module may be provided only with buffers and a robot as described above while a chamber that performs a certain process on a substrate W is not provided.

According to an embodiment of the inventive concept, in the drying operation of the substrate, the substrate is rotated and heated at the same time. Accordingly, the drying efficiency of the substrate may be increased.

Further, according to an embodiment of the inventive concept, the first heating member heats a first area of the substrate and the second heating member compensatively heats a second area that is different from the first area. Accordingly, the areas of the substrate may be uniformly heated.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
    a substrate support unit configured to support the substrate;
    a liquid supply unit configured to supply a liquid onto the substrate supported by the substrate support unit; and
    a heating unit configured to heat the substrate supported by the substrate support unit,
    wherein the substrate support unit includes:
      a support plate having a seating surface, on which the substrate is seated, and having a suction hole on the seating surface;
      a rotary shaft configured to rotate the support plate; and
      a vacuum member configured to reduce a pressure of the suction hole such that the substrate seated on the seating surface is vacuum-suctioned on the support plate,
    wherein the heating unit includes:
    a first heating member; and
    a second heating member located above the substrate supported by the substrate support unit,
    wherein the first heating member heats a peripheral area of the substrate, wherein the first heating member includes a heating plate,
    wherein the second heating member is positioned to heat a central area of the substrate,
    wherein the liquid supply unit includes:
    a treatment nozzle configured to supply a treatment liquid onto the substrate seated on the support plate above the support plate; and
    a cleaning nozzle installed in the heating plate and configured to supply a cleaning liquid to a bottom surface of the substrate seated on the support plate.

2. The substrate treating apparatus of claim 1, wherein the seating surface has an area that is smaller than the substrate, wherein the first heating member is located below the substrate supported by the substrate support unit and wherein the first heating member includes:
    the heating plate having a shape surrounding a circumference of the support plate; and
    a first heater provided in the heating plate,
    wherein the first heating member is positioned to heat a peripheral area of the substrate.

3. The substrate treating apparatus of claim 1, wherein the treatment liquid includes a development liquid.

4. The substrate treating apparatus of claim 1, wherein the liquid supply unit further includes:
    a rinsing nozzle configured to supply a rinsing liquid onto the substrate seated on the support plate above the support plate,
    wherein the substrate treating apparatus further comprises:
    a controller configured to control the liquid supply unit and the heating unit,
    wherein the controller controls the liquid supply unit and the heating unit to sequentially perform a treatment liquid supplying operation of supplying the treatment liquid onto the substrate, a rinsing liquid supplying operation of supplying the rinsing liquid onto the substrate, and a drying operation of removing the rinsing liquid residing on the substrate, and wherein the controller controls the substrate support unit to rotate the substrate at a treatment speed in the treatment liquid supplying operation, to rotate the substrate at a rinsing speed in the rinsing liquid supplying operation, and to rotate the substrate at a drying speed that is lower than the treatment speed and the rinsing speed in the drying operation.

5. The substrate treating apparatus of claim 1, wherein the first heating member further includes:

an elevation member configured to elevate one of the heating plate and the support plate to adjust a relative height between the heating plate and the support plate, wherein the elevation member moves the heating plate and the support plate by a first interval or a second interval that is smaller than the first interval, and wherein the controller moves the heating plate and the support plate by the first interval in the rinsing liquid supplying operation, and moves the heating plate and the support plate by the first interval in the drying operation.

6. A substrate treating apparatus comprising:

a support plate having a seating surface, on which the substrate is seated, and having a suction hole on the seating surface;

a liquid supply unit configured to supply a liquid onto the substrate supported by the support plate;

a rotary shaft configured to support a rotary plate;

a vacuum member configured to reduce a pressure of the suction hole; and a first heating member configured to heat a peripheral area of the substrate supported on the support plate, and a second heating member located above the substrate supported by the support unit, wherein the first heating member includes:

a heating plate surrounding a circumference of the support plate below the substrate supported on the support plate; and a first heater provided in the heating plate, wherein the second heating member is positioned to heat a central area of the substrate, wherein the liquid supply unit includes:

a treatment nozzle configured to supply a treatment liquid onto the substrate seated on the support plate above the support plate; and a cleaning nozzle installed in the heating plate and configured to supply a cleaning liquid to a bottom surface of the substrate seated on the support plate.

7. The substrate treating apparatus of claim 6, wherein the seating surface has an area that is smaller than the substrate, and wherein the heating plate has an inner diameter corresponding to an outer diameter of the support plate and having an annular ring shape having an outer diameter corresponding to the substrate.

8. The substrate treating apparatus of claim 7, wherein the first heating member further includes:

an elevation member configured to elevate one of the heating plate and the support plate to adjust a relative height between the heating plate and the support plate, and wherein the elevation member moves the heating plate and the support plate at a first interval or a second interval that is smaller than the first interval.

9. The substrate treating system of claim 6, a second heater located above the substrate supported on the support plate.

10. The substrate treating apparatus of claim 9, wherein the second heater has a circular plate shape having a diameter corresponding to the seating surface.

* * * * *